United States Patent [19]
Levy

[11] Patent Number: 5,170,251
[45] Date of Patent: Dec. 8, 1992

[54] METHOD AND APPARATUS FOR STORING HIGH DEFINITION VIDEO DATA FOR INTERLACE OR PROGRESSIVE ACCESS

[75] Inventor: Yoram Levy, Palo Alto, Calif.

[73] Assignee: Sony Corporation of America, Park Ridge, N.J.

[21] Appl. No.: 701,228

[22] Filed: May 16, 1991

[51] Int. Cl.[5] ............ H04N 7/01; H04N 5/16
[52] U.S. Cl. .................. 358/140; 358/160; 340/799
[58] Field of Search ........ 358/140, 160, 21 R; 340/814, 798, 799

[56] References Cited

U.S. PATENT DOCUMENTS

| | | | |
|---|---|---|---|
| 4,368,466 | 1/1983 | Dwire | 340/799 |
| 4,396,938 | 8/1983 | Dischert | 358/21 R |
| 4,617,564 | 10/1986 | Yoshioka | 340/798 |
| 4,951,042 | 8/1990 | Belch | 340/799 |
| 4,956,708 | 9/1990 | Itagaki | 358/140 |

Primary Examiner—James J. Groody
Assistant Examiner—S. Metjahic
Attorney, Agent, or Firm—Limbach & Limbach

[57] ABSTRACT

A method and apparatus in which data defining a high definition video frame are written into a memory in a manner so that the data can be linearly accessed from the memory in a selected (interlaced or progressive) format. In a preferred embodiment in which the data are written into a two megabyte memory in blocks of 128 pixels, with a 14-bit address for each block, the invention enables SMPTE-240M format high definition video data to be written into memory in a manner so that the data can be linearly accessed from memory in either an interlaced format or a progressive format. In an embodiment for storing (1920×1080)=2,073,600 pixels defining a high definition video frame, the apparatus of the invention includes a two megabyte memory and a thirty-two kilobyte PROM (or PAL) circuit. The thirty-two kilobyte circuit implements two look-up tables, each having a size of 16,384 bytes. In an interlace storage mode, the apparatus employs a first one of the look-up tables to assign interlaced format memory addresses to the pixel blocks being written into memory (so that the data can be linearly accessed from memory in interlaced format). In a progressive storage mode, the apparatus employs the other look-up table to assign "progressive format" memory addresses to the pixel blocks being written into memory (so that the data can be linearly accessed from memory in progressive format).

22 Claims, 3 Drawing Sheets

METHOD AND APPARATUS FOR STORING HIGH DEFINITION VIDEO DATA FOR INTERLACE OR PROGRESSIVE ACCESS

FIELD OF THE INVENTION

The invention is a method and apparatus for writing a high definition video signal into a memory, in a manner so that the data can be linearly accessed from the memory. More particularly, the invention is a method and apparatus for writing data representing a high definition video frame into a memory, in a manner so that the data can be linearly accessed from the memory in a selected format (either an interlaced format or a progressive format).

BACKGROUND OF THE INVENTION

The proposed SMPTE-240M standard for high definition digital video specifies that each frame of an SMPTE-240M video signal consists of 2200×1125 pixels, and that the frame rate is 30 video frames per second. There are 2200 pixels per line, including 1920 active video pixels and 280 pixels which comprise a horizontal blanking interval. Of the 1125 lines allocated to each frame, 1035 lines represent an even field and an odd field, and ninety lines comprise a vertical blanking interval. The vertical blanking intervals contain synchronization information.

Optionally, four of the ninety "vertical blanking interval" lines contain information specific to a particular frame. Also optionally, a total of 1080 lines (including forty-five of the "vertical blanking interval" lines) can be employed for creating square pixels.

It would be desirable to store 1920×1080=2,073,600 pixels defining a high definition video frame in a standard "two megabyte" memory (a memory capable of storing $2^{21}$=2,097,152 pixels). It would also be desirable to store such a set of 1920×1080 pixels, in a standard two megabyte memory, in a manner so that the pixels can be conveniently read out from memory in either an "interlaced" format or a "progressive" format.

To transmit a video signal in an "interlaced" format (or read the signal in interlaced format from memory), the odd field of each frame is transmitted (or read) before the even field of the frame. In other words, all the odd-numbered active video lines of the frame are transmitted (or read) before any of the even-numbered active video lines are transmitted (or read). When a video signal in such interlaced format is displayed on a video monitor, all of the odd lines appear on the monitor before any of the even lines appears on the monitor.

To transmit (or read) a video signal in a "progressive" format, the active video lines of a frame are transmitted (read) in consecutive order (line "1," followed by line "2," followed by line "3," and so on). When a progressive-format signal is displayed on a video monitor, the lines appear on the screen in this same consecutive order (with an odd line appearing immediately before each even line).

Until the present invention, it was not known how to write data representing a high definition video frame into a memory, in a manner so that the data could be efficiently read from the memory in a selected format (either an interlaced format or a progressive format).

SUMMARY OF THE INVENTION

The invention is a method and apparatus in which data defining a high definition video frame are written into a memory in a manner so that the data can be linearly accessed from the memory in a selected format (either an interlaced format or a progressive format).

In a preferred embodiment, the data are written into memory in blocks of 128 pixels, with a 14-bit address for each block. This embodiment of the invention is particularly useful for writing data representing a high definition video frame having SMPTE-240M format into a memory, in a manner so that the data can be linearly accessed from memory in either an interlaced format or a progressive format. Typically, the data are in an interlaced format before they are written into memory.

In a preferred embodiment for storing 1920×1080 (=2,073,600) pixels defining a high definition video frame, the apparatus of the invention includes a two megabyte memory (capable of storing $2^{21}$=2,097,152 pixels) and a thirty-two kilobyte PROM (or PAL) circuit. The thirty-two kilobyte circuit implements two look-up tables, each having a size of 16,384 bytes. In an interlace storage mode, the apparatus employs a first one of the look-up tables to assign "interlaced format" memory addresses to the pixel blocks being written into memory (so that the data can be linearly accessed from memory in interlaced format). In a progressive storage mode, the apparatus employs the other look-up table to assign "progressive format" memory addresses to the pixel blocks being written into memory (so that the data can be linearly accessed from memory in progressive format).

In both the interlace and the progressive storage mode, pixels blocks representing an entire high definition video frame are written into a linear map memory in a manner which enables the memory to be linearly accessed in a desired format (either interlaced or progressive).

DETAILED DESCRIPTION OF THE PREFERRED EMBODIMENT

A first preferred embodiment of the invention will be described with reference to FIGS. 1 and 2. This embodiment is particularly useful for storing 1920×1080=2,073,600 pixels defining a high definition video frame (or as many as 1092 lines of video data, each line comprising 1920 pixels) in a standard two megabyte memory. However, it will be readily apparent how to design variations on these embodiments that are within the scope of the invention, and useful for storing other digital signals representing high definition video data.

Figure 1:
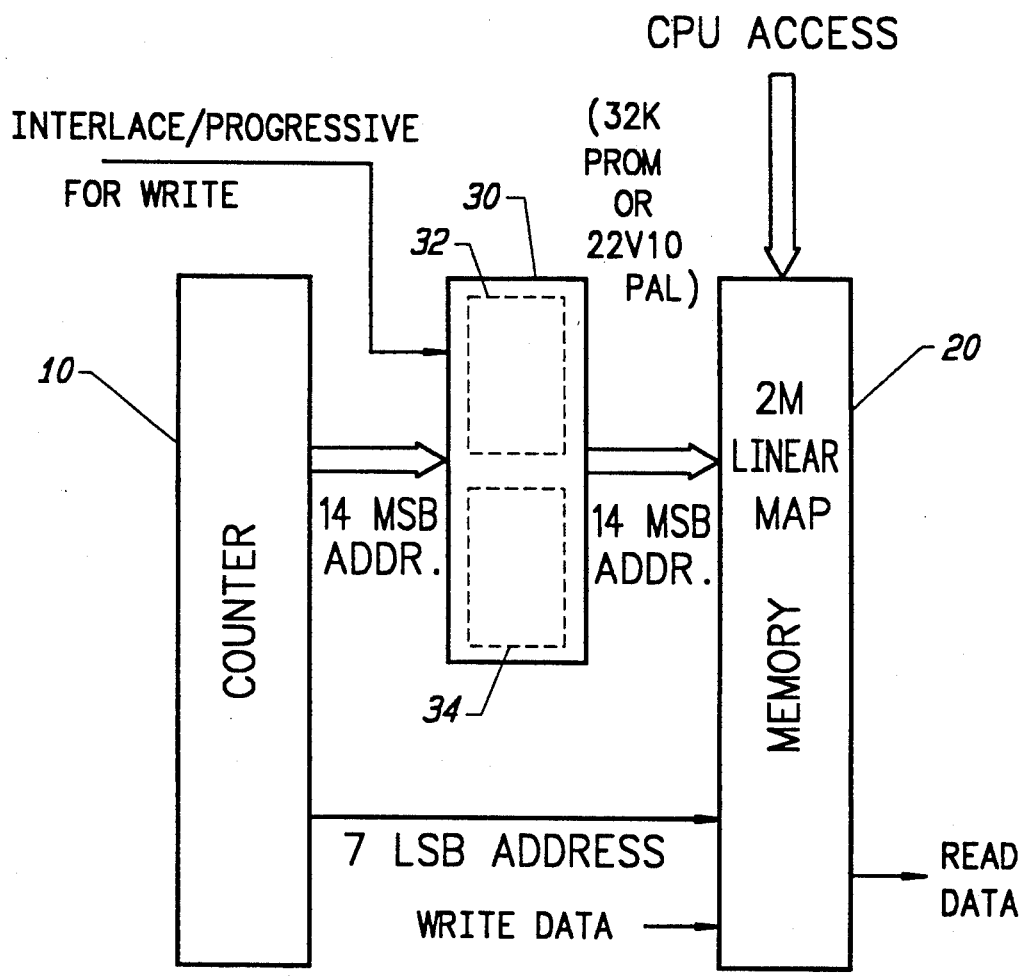
FIG. 1 is a block diagram of a first preferred embodiment of the invention.
Figure 2:
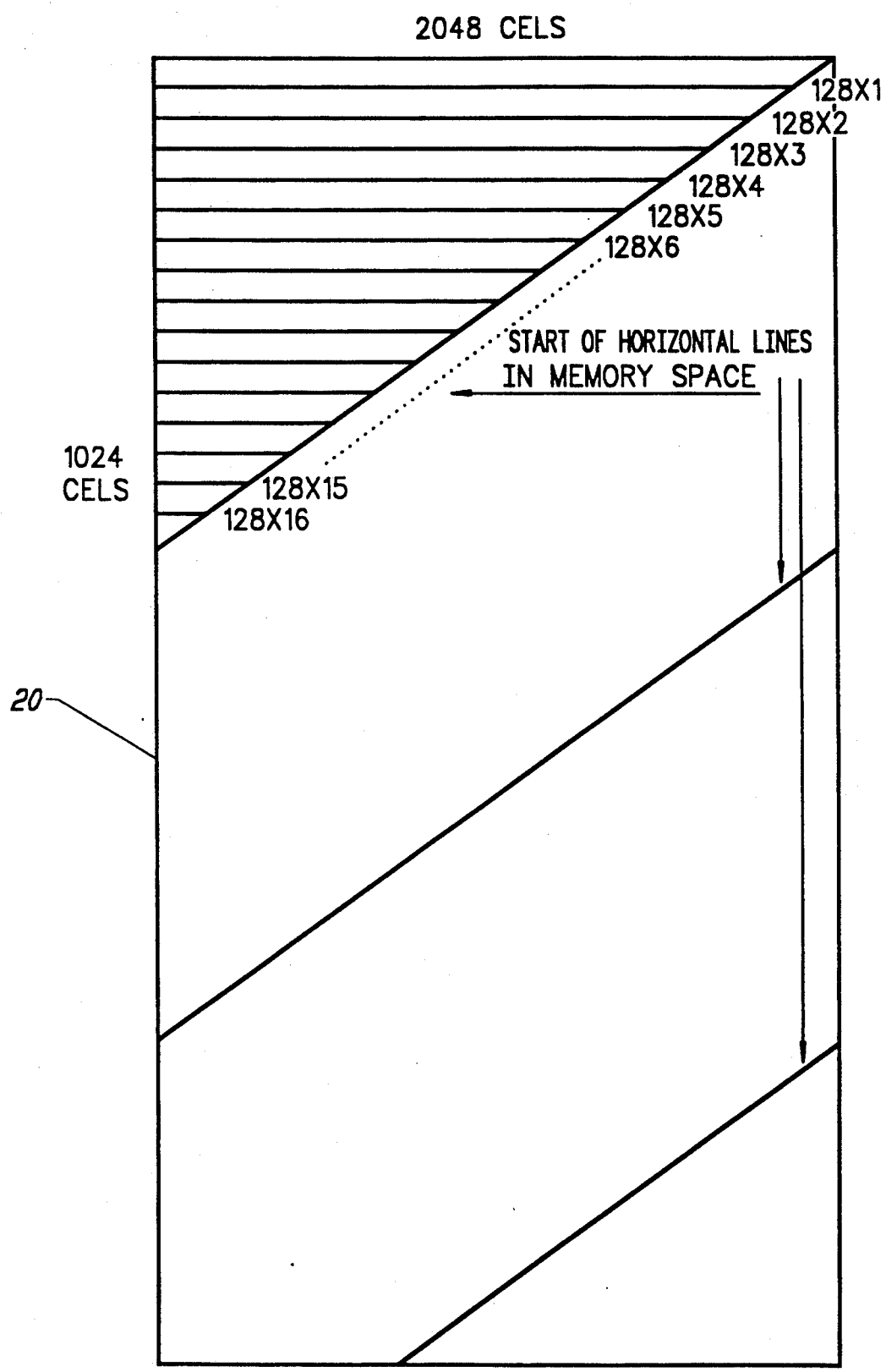
FIG. 2 is a diagram representing memory locations in the memory circuit of FIG. 1.

In FIG. 1, a stream of digital data (identified as "WRITE DATA") to be stored is supplied to an input of linear map memory unit 20. The data consist of MX pixels which define a high definition video frame, where M and X are integers. In response to externally generated control signals ("CPU ACCESS" signals), supplied for example from a central processing unit (not shown), data are written into memory 20, and data stored in memory 20 are read out from memory.

Memory 20 should be linearly accessible, in the sense that its memory locations map to a grid of rows and columns, and data stored in successive rows or columns of the grid can be sequentially read out. Memory 20 is preferably a linear map memory having Y rows (or columns) and MZ columns (or rows) of memory locations, where Y and Z are integers, and M is the same integer specified in the previous paragraph. To minimize the size (and thus the cost) of memory 20, the product YZ should equal X.

In accordance with the invention, data is stored in such a linear map memory in blocks of M pixels, with each block identified by an address. The invention implements two or more data storage modes, with each mode implementing a different algorithm for determining the most significant bits of each pixel block address.

For example, in one preferred embodiment of the invention, $M=128$, $X=(15\times 1080)$, $Y=1024$, and $Z=16$. In this case, the WRITE DATA consists of $(15\times 128)\times 1080 = 1920 \times 1080 = 2,073,600$ pixels which define an SMPTE-240M high definition video frame, and memory 20 is a standard two megabyte memory chip (integrated circuit) of the type having memory cells as mapped in FIG. 2. The two megabyte memory of FIG. 2 has $Y=1024$ rows, and $M\times Z=2048$ columns of memory cells, with each row thus having 2048 memory cells. This two megabyte memory has capacity to store $2^{21}=2,097,152$ pixels, so that a 21 bit address is sufficient to identify each stored pixel.

The inventor has recognized that if the data are written into memory in blocks of 128, only 14 bits of the 21-bit address are dynamic. Accordingly, a twenty-one bit counter circuit 10 and thirty-two kilobyte circuit 30 (having 32,768 byte capacity), as shown in FIG. 1, are sufficient to generate two alternative sets of addresses for storing 2,097,152 pixels in memory 20.

The seven least significant address bits asserted by twenty-one bit counter 10 are supplied directly to memory 20. The fourteen most significant address bits asserted by counter 10 are supplied to the input of circuit 30.

Circuit 30 implements look-up tables 32 and 34. Each of look-up tables 32 and 34 has a size of 16,384 bytes. Only a selected one of tables 32 and 34 is used at a time. In an interlace storage mode, only look-up table 32 is enabled (table 34 is disabled). In a progressive storage mode, only table 34 is enabled (table 32 is disabled).

In the interlace storage mode, table 32 asserts (to memory 20) the fourteen most significant bits of an "interlaced format" memory address in response to each fourteen-bit input signal asserted at the input of circuit 30. It is useful to refer to FIG. 2 to appreciate the simplicity of this address signal generating scheme. In the interlace storage mode, the first fifteen blocks of 128 pixels (which collectively represent the first horizontal line of active video in the first odd field) are assigned to the first fifteen groups of 128 memory cells in the first row of memory 20. Then, the second fifteen blocks of 128 pixels (which collectively represent the second horizontal line of active video in the first odd field) are assigned to the next fifteen groups of 128 memory cells (the last group of 128 cells in the first row, and the first fourteen groups of 128 cells in the second row). After the last horizontal line of active video in the first odd field has been assigned (to a set of fifteen groups of 128 memory cells in rows numbered 506 and 507), the first horizontal line of active video in the first even field is assigned to the next set of fifteen groups of 128 memory cells (occupying rows numbered 507 and 508). The process continues until all lines of the even field have been assigned locations (in rows 507 through 1013 of memory 20).

In the progressive storage mode, table 34 asserts (to memory 20) the fourteen most significant bits of a "progressive format" memory address in response to each fourteen-bit input signal asserted at the input of circuit 30. Again with reference to FIG. 2, in the progressive storage mode, the first fifteen blocks of 128 pixels (which collectively represent the first horizontal line of active video in the first odd field) are assigned to the first fifteen groups of 128 memory cells in the first row. Then, the second fifteen blocks of 128 pixels (which collectively represent the second horizontal line of active video in the first odd field) are assigned to the third set of fifteen groups of 128 memory cells (the last two groups of 128 cells in the second row, and the first thirteen groups of 128 cells in the third row). After the last horizontal line of active video in the first odd field has been assigned (to a set of fifteen groups of 128 memory cells in rows numbered 1012 and 1013), the first horizontal line of active video in the first even field is assigned to the second set of fifteen groups of 128 memory cells (the last group of 128 cells in the first row, and the first fourteen groups of 128 cells in the second row). The process continues until all lines of the even field have been assigned locations (in rows 1 through 1013 of memory 20).

Thus, when data stored during the "progressive storage mode" is linearly accessed from memory 20 (in row order), a line from the even field will be read out immediately after each line from the odd field is read out. In contrast, when data stored during the "interlace storage mode" is linearly accessed from memory 20 (in row order), all lines from the odd field will be read out before any line from the even field is read out.

In summary, during the "interlaced storage mode, table 32 asserts consecutive fourteen-bit addresses (1, 2, 3, 4, 5, etc.) in response to consecutive input addresses (1, 2, 3, 4, 5, etc.). During the "progressive storage mode, table 34 asserts fourteen-bit addresses in the following non-consecutive sequence: 1, 3, 5, ..., 2, 4, 6, etc., in response to consecutive input addresses (1, 2, 3, 4, 5, etc.).

The operating mode of circuit 30 can be changed at any time by supplying a control signal (the signal "Interlace/Progressive" in FIG. 1) thereto. In a preferred embodiment, the control signal is a one-bit signal, and circuit 30 enables a selected one of tables 32 and 34 (and disables the other one of tables 32 and 34) in response to the one-bit control signal. The control signal can be user-generated (at random times) or can be generated automatically in a central processing unit (not shown). In one example, the central processing unit is programmed to supply the control signal to circuit 30 only during vertical blanking intervals (between periods in which the data to be stored is asserted at an input of memory 20).

In one embodiment, circuit 30 is a 32K byte PROM circuit, with tables 32 and 34 implemented in firmware. In an alternative embodiment, circuit 30 is a 32K byte PAL circuit (of the 22V10 type), with tables 32 and 34 implemented in logic circuitry. In the latter case, the logic circuitry can include multiplier circuitry for calculating the pixel addresses.

Of course, the look-up tables within circuit 30 need not output addresses for implementing interlace mode or progressive mode storage. It is within the scope of the invention to design the look-up tables to implement any of a wide variety of storage modes. For example, the look-up tables can be programmed to output pixel block addresses for storing high definition video lines in semi-interlaced line order, or some other desired line order.

The capacity of memory 20 in FIG. 1 need not be two megabytes, and should depend on the intended application of the FIG. 1 apparatus and the volume of high definition video data to be stored therein at any one time.

An alternative preferred embodiment of the inventive apparatus will next be described with reference to FIG. 3. The FIG. 3 apparatus is identical to the FIG. 1 apparatus, except that the FIG. 3 apparatus include following additional components: a second two megabyte linear map memory unit 60 (identical to linear map memory unit 20), and a second thirty-two kilobyte circuit 50 (identical to circuit 30).

The stream of digital data ("WRITE DATA") to be stored is asserted at an input of memory unit 60 and also at an input of memory unit 20. To implement double buffering, memory 20 and memory 60 alternately store portions of the WRITE DATA, and data stored in memories 20 and 60 are read out alternately from memory 20 and memory 60. For example, memories 20 and 60 can alternately store sets of (1920×1080)= 2,073,600 pixels, with each set of 2,073,600 pixels defining a high definition video frame.

Figure 3:
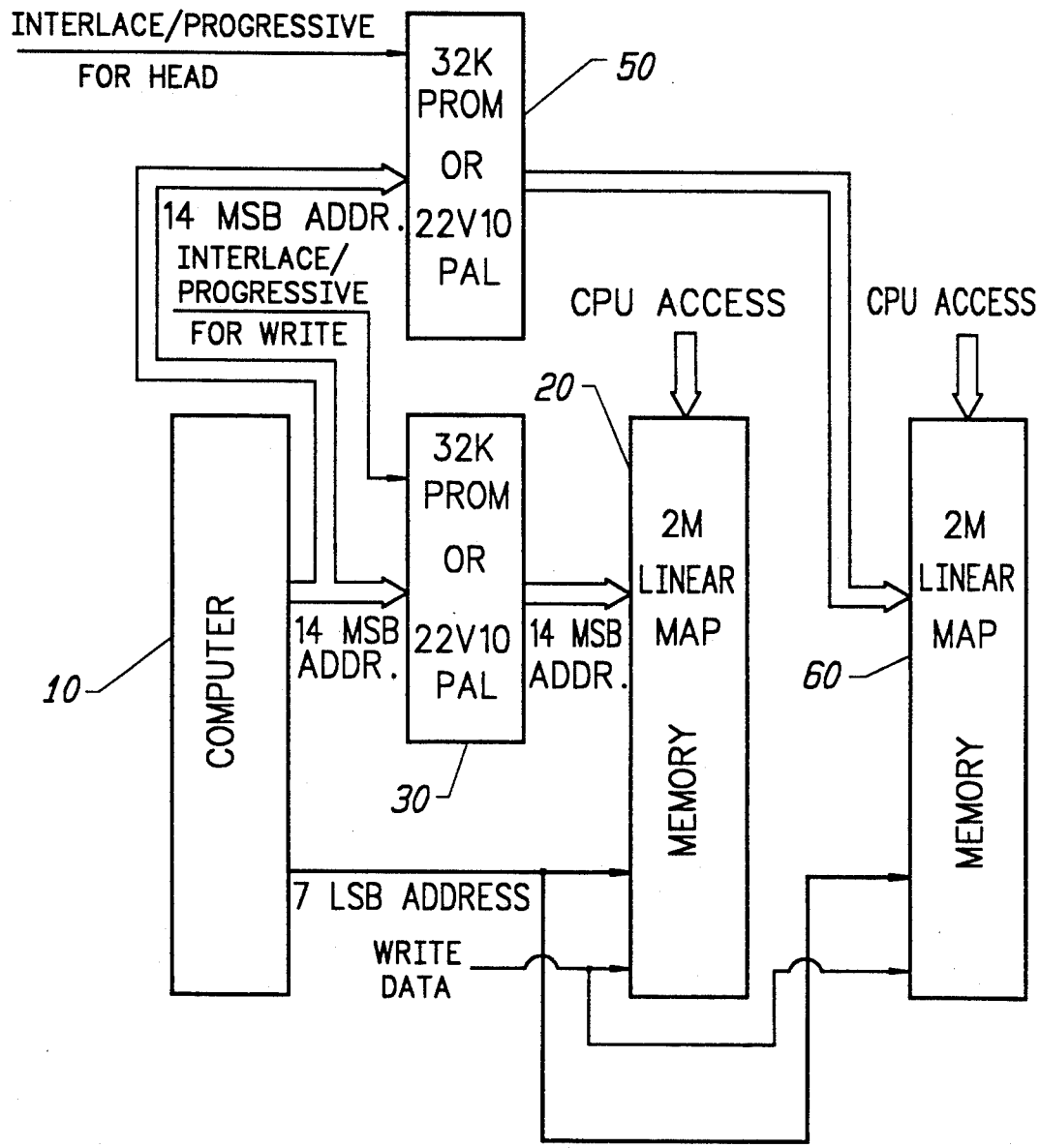
FIG. 3 is a block diagram of a second preferred embodiment of the invention.

In the FIG. 3 embodiment, the seven least significant bits of the 21-bit address signal asserted by counter 10 are supplied directly to both memory 20 and memory 60. The fourteen most significant bits of the output of counter 10 are supplied both to an input of circuit 30 and to an input of circuit 50.

Each of circuits 30 and 50 also receives a mode control signal (i.e., one of the signals labeled "Interlace/Progressive" in FIG. 3). Each mode control signal is preferably a one-bit signal, and can be generated as described above with reference to the "Interlace/Progressive" mode control signal of the FIG. 1 embodiment. Each of circuits 30 and 50 implements two independently-selectable look-up tables, which can be of any of the types mentioned above with reference to FIG. 1, to output a fourteen-bit, mode-specific address signal in response to each fourteen-bit signal from counter 10.

In response to externally generated control signals (the "CPU ACCESS" signals of FIG. 3), supplied for example from a central processing unit (not shown), data are written into one or both of memories 20 and 60, and data stored in one or both of memories 20 and 60 are read out from memory.

For example, while pixels representing one video frame are written into memory 20, pixels representing a different video frame can be read out from memory 60. To accomplish such a simultaneous read and write operation, the following steps are performed: a desired look-up table within circuit 30 is selected, circuit 30 outputs a stream of fourteen-bit addresses to memory 20, and memory 20 simultaneously receives the fourteen-bit addresses output from circuit 30, seven-bit addresses from counter 10, and WRITE DATA (in order to write the WRITE DATA into memory 20). Contemporaneously, a desired look-up table within circuit 50 is selected, circuit 50 outputs a stream of fourteen-bit addresses to memory 60, and memory 60 reads out data identified by the fourteen-bit addresses output from circuit 50 and seven-bit addresses received simultaneously from counter 10. The roles of circuit 30 and memory 20 (on one hand), and circuit 50 and memory 60 (on the other hand) can then be reversed, in order to read data from memory 20 while writing different data into memory 60.

Typically, the CPU ACCESS signals are updated only during system initialization or during vertical blanking intervals between video fields or frames.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such specific embodiments.

What is claimed is:

1. An apparatus for storing digital video data, wherein the data includes MX pixels, where M and X are integers, the apparatus including:
  a memory means having linearly accessible memory locations which map into a grid of MZ x Y locations, where Z and Y are integers; and
  a memory access means for writing the data into the memory means in blocks of M pixels, wherein the memory access means includes an address generation means for generating an address signal for each block of M pixels of the data, wherein the address generation means includes:
  a counter which generates a counter signal having most significant bits and least significant bits, including a means for supplying the least significant bits to the memory means; and
  a mode-specific address generation means for receiving the most significant bits of the counter signal, said mode-specific address generation means including:
  first look-up table means for generating a first address signal for said each block of M pixels from the most significant bits of the counter signal, and supplying the first address signal to the memory means;
  second look-up table means for generating a second address signal for said each block of M pixels from the most significant bits of the counter signal, and supplying the second address signal to the memory means; and
  mode-selection means for enabling a selected one of the first look-up table means and the second look-up table means in response to a mode selection signal.

2. The apparatus of claim 1, wherein the mode selection signal is a one-bit signal.

3. The apparatus of claim 1, wherein the memory means stores the data in an interlace format in response to the first address signal and the least significant bits of the counter signal, and the memory means stores the data in a progressive format in response to the second address signal and the least significant bits of the counter signal.

4. The apparatus of claim 1, wherein the memory access means also includes a read means for reading digital data from the memory means in blocks of M pixels, wherein the read means reads the digital data from the memory means in an interlace format in response to the first address signal and the least significant bits of the counter signal, and wherein the read means reads the digital data from the memory means in a progressive format in response to the second address signal and the least significant bits of the counter signal.

5. The apparatus of claim 1, wherein the least significant bits are a seven-parallel-bit stream, the most significant bits are a fourteen-parallel-bit stream, the first address signal is a fourteen-parallel-bit stream, and the second address signal is a fourteen-parallel-bit stream.

6. The apparatus of claim 1, wherein the digital video data represent a high definition video frame.

7. The apparatus of claim 1, also including:
a second memory means having linearly accessible memory locations which map into said grid of MZ x Y locations, and wherein the memory access means includes means for writing the data into the second memory means in blocks of M pixels.

8. The apparatus of claim 7, wherein the counter includes means for supplying the least significant bits to the second memory means, and wherein the address generation means includes:
a second mode-specific address generation means for receiving the most significant bits of the counter signal, said second mode-specific address generation means including:
first look-up table means for generating a first address signal for said each block of M pixels from the most significant bits of the counter signal, and supplying the first address signal to the second memory means;
second look-up table means for generating a second address signal for said each block of M pixels from the most significant bits of the counter signal, and supplying the second address signal to the second memory means; and
mode-selection means for enabling a selected one of the first look-up table means and the second look-up table means in response to a mode selection signal.

9. The apparatus of claim 1, wherein MX is equal to 2,073,600, and wherein the memory means has 2,097,152 storage locations.

10. The apparatus of claim 1, wherein the digital video data are SMPTE-240M format high definition digital video data.

11. The apparatus of claim 5, wherein a single thirty-two kilobyte circuit includes the first look-up table means and the second look-up table means, and wherein the counter is a twenty-one bit counter circuit.

12. A method for storing digital video data comprising MX pixels in a memory means having linearly accessible memory locations which map into a grid of MZ x Y locations, where M, X, Y, and Z are integers, including the steps of:
(a) writing the data into the memory means in blocks of M pixels;
(b) generating a counter signal having most significant bits and least significant bits;
(c) supplying the least significant bits directly to the memory means; and
(d) contemporaneously with step (a), generating an address signal for each block of M pixels of the data by converting the most significant bits to a first address signal for said each block of M pixels in a first look-up table means and supplying the first address signal to the memory means in response to a first mode selection signal, and converting the most significant bits to a second address signal for said each block of M pixels in a second look-up table means and supplying the second address signal to the memory means in response to a second mode selection signal.

13. The method of claim 12, wherein during step (a), the data re written into the memory means in an interlace format in response to the first address signal and the least significant bits of the counter signal, and wherein during step (a), the data are written into the memory means in a progressive write mode in response to the second address signal and the least significant bits of the counter signal.

14. The method of claim 12, wherein the least significant bits are a seven-parallel-bit stream, the most significant bits are a fourteen-parallel-bit stream, the first address signal is a fourteen-parallel-bit stream, and the second address signal is a fourteen-parallel-bit stream.

15. The method of claim 12, wherein the digital video data represent a frame of a high definition video signal.

16. The method of claim 12, wherein MX is equal to 2,073,600, and wherein the memory means has 2,097,152 storage locations.

17. A method for reading digital video data comprising MX pixels from a memory means having linearly accessible memory locations which map into a grid of MZ x Y locations, where M, X, Y, and Z are integers, including the steps of:
(a) generating address signals, each representing a block of M pixels of the data, by generating a counter signal having most significant bits and least significant bits;
supplying the least significant bits directly to the memory means;
in response to a first mode selection signal, converting the most significant bits to a first address signal for said each block of M pixels in a first look-up table means, and supplying the first address signal to the memory means; and
in response to a second mode selection signal, converting the most significant bits to a second address signal for said each block of M pixels in a second look-up table means, and supplying the second address signal to the memory means; and
(b) in response to the address signals, reading the data from the memory means in blocks of M pixels.

18. The method of claim 17, wherein the data is read from the memory means in an interlace format in response to the first address signals and the least significant bits of the counter signal, and the data is read from the memory means in a progressive format in response to the second address signals and the least significant bits of the counter signal.

19. The method of claim 17, wherein the least significant bits are a seven-parallel-bit stream, the most significant bits are a fourteen-parallel-bit stream, the first address signal is a fourteen-parallel-bit stream, and the second address signal is a fourteen-parallel-bit stream.

20. The method of claim 17, wherein the digital video data represent a frame of a high definition video signal.

21. The method of claim 17, wherein MX is equal to 2,073,600, and wherein the memory means has 2,097,152 storage locations.

22. The method of claim 12, wherein the digital video data are SMPTE-240M format high definition digital video data.

* * * * *